United States Patent
Kawashima et al.

(10) Patent No.: US 6,188,380 B1
(45) Date of Patent: Feb. 13, 2001

(54) PHOTODETECTOR OF LIQUID CRYSTAL DISPLAY AND LUMINANCE CONTROL DEVICE USING THE SAME

(75) Inventors: Hiroshi Kawashima; Tatsuhisa Nitta; Yoshiyuki Nakashima, all of Ishikawa (JP)

(73) Assignee: NANAO Corporation (JP)

(*) Notice: Under 35 U.S.C. 154(b), the term of this patent shall be extended for 0 days.

(21) Appl. No.: 09/015,719

(22) Filed: Jan. 29, 1998

(30) Foreign Application Priority Data

Feb. 3, 1997 (JP) .................................................. 9-020442
Feb. 3, 1997 (JP) .................................................. 9-020443

(51) Int. Cl.[7] .......................... G09G 3/36; G02F 1/1333; G02F 1/1335; H01J 40/14
(52) U.S. Cl. .............................. 345/102; 345/87; 349/56; 349/58; 349/64; 250/214 AG; 250/214 PR
(58) Field of Search ................................... 345/102, 101, 345/147, 87; 349/56, 9, 64, 58, 65, 67, 69, 70; 250/261, 214 PR, 214 AG, 214 DC

(56) References Cited

U.S. PATENT DOCUMENTS

| 5,786,801 | * | 7/1998 | Ichise ................................. 345/102 |
| 5,796,451 | * | 8/1998 | Kim ..................................... 349/66 |
| 5,818,553 | * | 10/1998 | Koenck et al. ........................ 349/61 |
| 5,886,759 | * | 3/1999 | Mashino et al. ...................... 349/65 |

FOREIGN PATENT DOCUMENTS

| 60-26990 | | 2/1985 | (JP) . |
| 62-125329 | * | 6/1987 | (JP) . |
| 5-13178 | | 1/1993 | (JP) . |
| 5-127602 | | 5/1993 | (JP) . |
| 5-241512 | | 9/1993 | (JP) . |

* cited by examiner

Primary Examiner—Mark R. Powell
Assistant Examiner—Ryan Yang
(74) Attorney, Agent, or Firm—Ostrolenk, Faber, Gerb & Soffen, LLP

(57) ABSTRACT

A combination includes a liquid crystal module having a liquid crystal panel forming a front surface, an opposing back surface, and a backlight structured and arranged to transmit light between the front and back surfaces. A light sensor located behind the back surface detects light transmitted from the backlight through the back surface. The light sensor detects a quantity of light when the backlight is lit at a maximum luminance, and outputs a signal indicative of the quantity of light. A luminance setting means sets a desired luminance by a user as a function of a desired percentage of the maximum lumination of the backlight. A control means controls the luminance of the backlight using the signal as a reference so that the luminance set by the luminance setting means is achieved.

8 Claims, 5 Drawing Sheets

PHOTODETECTOR OF LIQUID CRYSTAL DISPLAY AND LUMINANCE CONTROL DEVICE USING THE SAME

BACKGROUND OF THE INVENTION

1. Field of the Invention

The present invention relates to a photodetector of a liquid crystal display apparatus, and more particularly to a luminance control device using the same. More particularly, the present invention relates to a photodetector that detects the quantity of light from the backlight of a liquid crystal display apparatus, and a luminance control device using this photodetector for controlling luminance of the backlight.

2. Description of the Background Art

In the last few years, liquid crystal displays have become widely used in personal computers, word processors and the like. A light source called a backlight is provided in the liquid crystal display to illuminate the surface plane from the rear. A cold cathode fluorescent tube, for example, is used as the light source. The backlight can have the brightness adjusted arbitrary by a user. However, the contrast may be degraded due to change in the brightness of the ambient light.

A display device for maintaining an appropriate display state is disclosed in Japanese Patent Laying-Open No. 60-26990, for example. According to this display device, the light of a light source is directly detected by a light sensor. Also, the provision of a light blocking film to improve the detection performance of only the light source is disclosed.

Japanese Patent Laying-Open No. 62-125329 discloses a transmissive type liquid crystal display including a back photodetector device for detecting indirectly the light of a lamp through a transparent plate. A light blocking layer is formed around the detector device to block off ambient light.

In general, liquid crystal display units are commercially available from manufacturers in the form of a unitary element in which a liquid crystal panel, a backlight, a light directing plate, and a reflector sheet are provided integrally. The provision of a light sensor therein will require a particular modification, which results in an increase in cost. In the case where the light sensor is to be provided between the liquid crystal panel and the backlight, the light sensor must be located at a corner location that does not interfere with the liquid crystal panel. There is a disadvantage in that the area it occupies is increased and the accuracy with which it detects by is degraded.

The quantity of light from a backlight is reduced over long periods of usage. The end of the backlight is set as the time when the luminance has become lower than 50% of the initial value. Since it is difficult for a general user to determine this value, a detecting device that notifies a user is disclosed in, for example, Japanese Patent Laying-Open No. 5-13178. According to this device, the quantity of the light from the backlight is detected by a light quantity sensor and amplified. An alarm is sounded to notify the user when the level becomes lower than 50% of its initial value.

A cold cathode fluorescent tube used as the backlight shows a variation in brightness as an initial characteristic. Light is not emitted continuously at the same luminance. As a result of this characteristic, it is difficult to accurately detect when the luminance drops below 50% for each of the backlights. In general, a phototransistor, a photodiode, and the like are used as the quantity light sensor. As the quantity light sensor per se has some deviation, a reduction of 50% in luminance is difficult to be accurately detected.

SUMMARY OF THE INVENTION

A main object of the present invention is to provide a photodetector of a liquid crystal display that can detect light passing through a reflector sheet of the liquid crystal display.

Another object of the present invention is to provide a luminance control device of a liquid crystal display backlight that can cancel the influence caused by variations in the luminance of the backlight and in the sensitivity of the sensor itself and thus allow accurate detection of luminance degradation.

According to an aspect of the present invention, a photodetector for detecting light from the backlight of a liquid crystal display includes a light sensor provided at the rear of the liquid crystal display for detecting light transmitted from the backlight.

According to the present invention, a liquid crystal display including a liquid crystal panel, a backlight, a light directing plate, a reflector sheet, and the like are formed integrally and can be easily equipped with a photodetector and a reduced cost.

Preferably, the liquid crystal display has a liquid crystal panel, a diffusion sheet, a light collective sheet, a light directing plate, and a reflector sheet which are arranged as a unit. A fluorescent tube for backlight is provided at the end of the light directing plate. The light sensor is provided at the reflector sheet side to detect light passing through the reflector sheet.

Further preferably, a cushion member is provided to direct only the light passing through the reflector sheet to the light sensor. The light sensor is attached to a printed circuit board (PCB). A sense antenna for detecting the electric field radiation from the liquid crystal display is provided at the periphery of the light sensor.

According to another aspect of the present invention, a luminance control device controls the luminance of a backlight for illuminating a liquid crystal display. The quantity of light when the backlight is lit at the maximum luminance is detected by a photodetector. When a user sets a desired luminance through a luminance setting device, the luminance of the backlight is controlled using the previously detected quantity of light as a reference, to achieve the luminance level set by the luminance setting device.

According to a further aspect of the present invention, control is provided so that the influence due to variations in the luminance of the backlight and in the sensitivity of the sensor itself is canceled to obtain an accurate luminance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
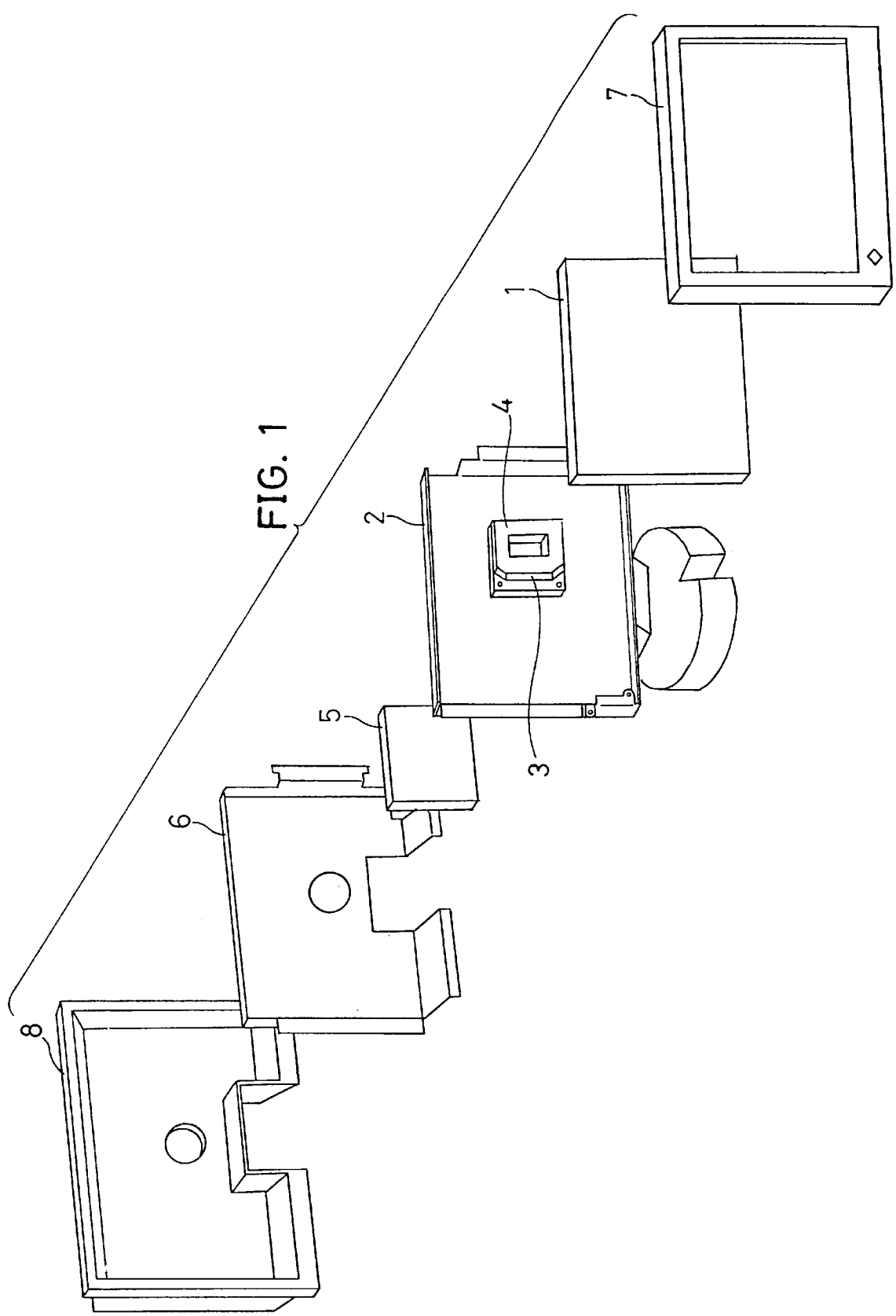
FIG. 1 is an exploded perspective view of a liquid crystal display according to an embodiment of the present invention.

Referring to FIG. 1, a base 2 is provided at the rear of a liquid crystal module 1. A light sensor attached to a printed circuit board (PCB) 3 is fixed to a centrol location of base 2. The light sensor detects light from the backlight passing through the rear of liquid crystal module 1. A doughnut-shaped cushion 4 for blocking light is provided between liquid crystal module 1 and sensor PCB 3 so that the light sensor detects only the light from the backlight.

A printed circuit board (PCB) 5 of a controller is provided at the rear of base 2. An aluminum blocking plate 6 is provided at the rear of PCB 5. Liquid crystal module 1, base 2, sensor PCB 3, doughnut-shaped cushion 4, PCB 5, and blocking plate 6 are formed integrally by a front cover 7 and a back cover 8. Although cushion 4 closely adheres to liquid crystal module 1 in order to block light, the pressure is such that no display unevenness will occur on LCD panel 11 due to the cushion effect.

Figure 2:
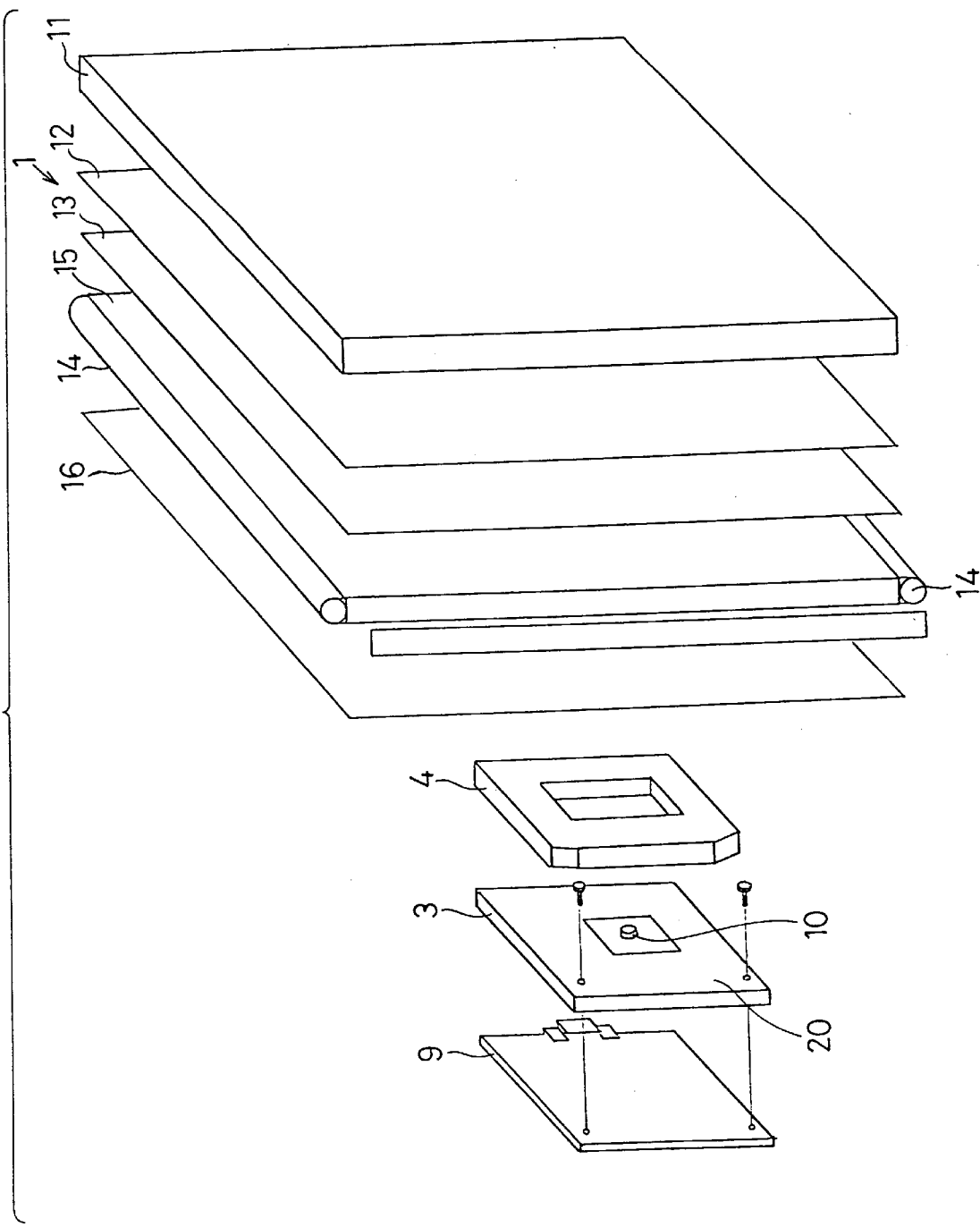
FIG. 2 is an exploded perspective view of the liquid crystal module and photodetector of FIG. 1.

FIG. 2 is an exploded perspective view of the liquid crystal module and the photodetector shown in FIG. 1. Referring to FIG. 2, liquid crystal module 1 includes an LCD panel 11, a diffusion sheet 12, a light collective sheet 13, a fluorescent tube 14, a light directing plate 15, and a reflector sheet 16. A respective fluorescent tube 14 is provided at opposite ends of light directing plate 15. The light from fluorescent tube 14 is directed onto LCD panel 11 by light directing plate 15, and the entire surface of LCD panel 11 is illuminated by light collective sheet 13 and diffusion sheet 12.

Reflector sheet 16 is provided at the rear of light directing plate 15. Most of the light directed from light directing plate 15 is guided towards light collective sheet 13. However, a portion of the light passes through reflector sheet 16 i.e., reflector sheet 16 is translucent. This light is detected by light sensor 10 attached to sensor PCB 3 via cushion 4. Sensor PCB. 3 is attached to base 2 of FIG. 1 by a PCB attachment 9.

A sense antenna 20 is provided around light sensor 10 on sensor PCB 3. Sense antenna 20 detects the electric field component leaking out from liquid crystal module 1. Unnecessary electric field radiation can be canceled, for example, by applying an opposite polarity voltage of the detected electric field to an antenna (not shown) provided around liquid crystal module 1. The number of components can be reduced by attaching light sensor 10 and sense antenna 20 to sensor PCB 3. As a result, the cost can be reduced.

Figure 3:
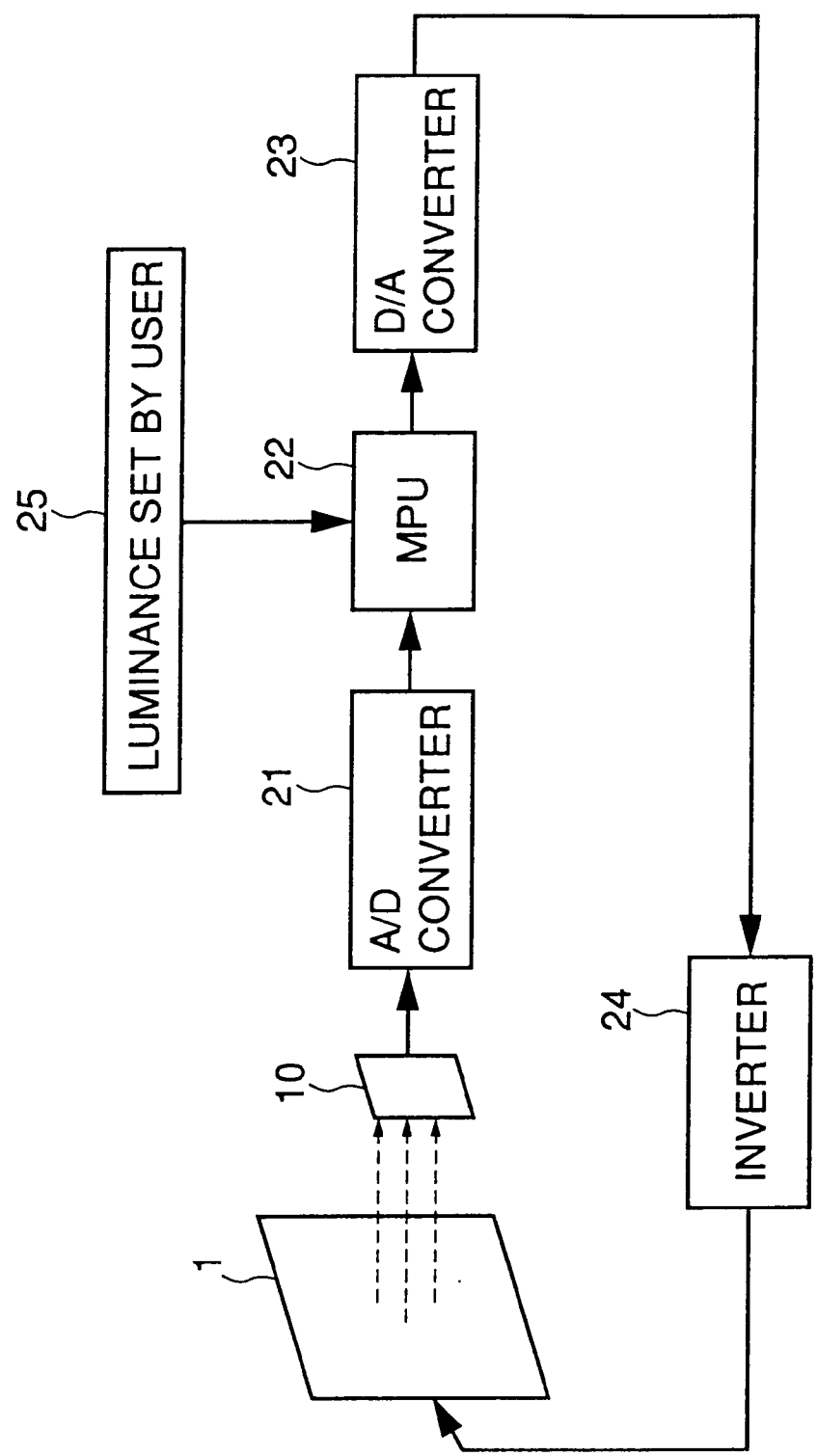
FIG. 3 is a schematic block diagram of a control circuit which detects light from a backlight with a light sensor, shown in FIGS. 1 and 2, to control the quantity of light.

FIG. 3 is a block diagram of a control circuit for controlling the luminance of the backlight. Referring to FIG. 3, the detected output from light sensor 10 is provided to an A/D converter 21 to be converted into a digital signal. The digital signal is provided to a MPU 22. MPU 22 computes a luminance control signal so that fluorescent tube 14 emits light at the luminance level set by a user with a setting device 25. The output luminance control signal is converted into an analog signal by a D/A converter 23 to be provided to an inverter 24. Inverter 24 drives fluorescent tube 14 of liquid crystal module 1 according to the provided analog signal. The optimum display state can be maintained by MPU 22 providing a luminance control signal that attains the luminance set by the user through setting device 25 while monitoring the detected output of light sensor 10.

According to the present invention, light sensor 10 provided at the rear of liquid crystal module 1 detects light transmitted from fluorescent tube 14 serving as a backlight. Therefore, a photodetector can be easily attached to a liquid crystal display including LCD panel 11, the backlight, light directing plate 15, reflector sheet 16 and the like, which are formed integrally. Accordingly, the cost can be reduced.

Figure 4:
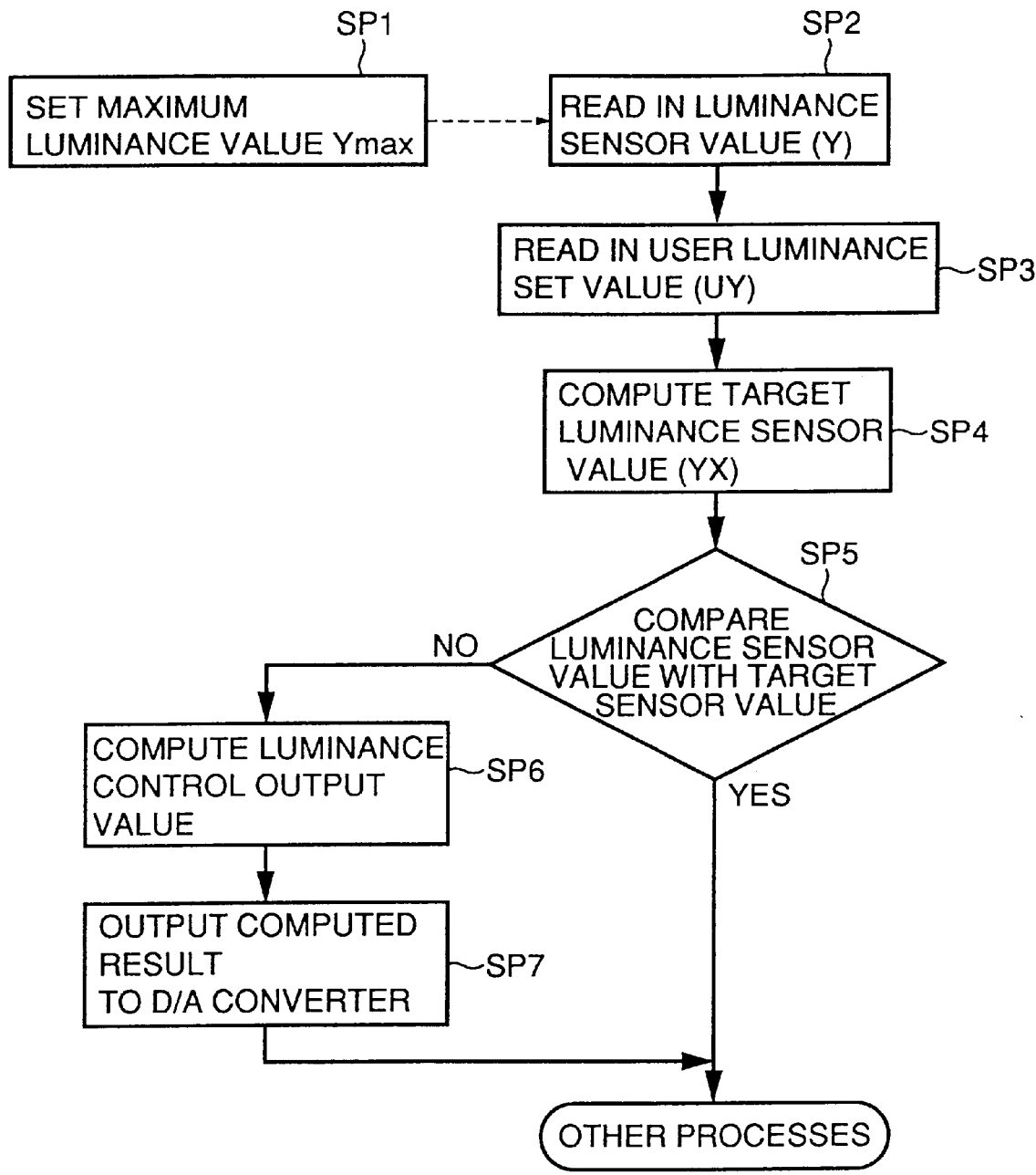
FIG. 4 is a flow chart for describing a specific operation of an embodiment of the present invention.
Figure 5:
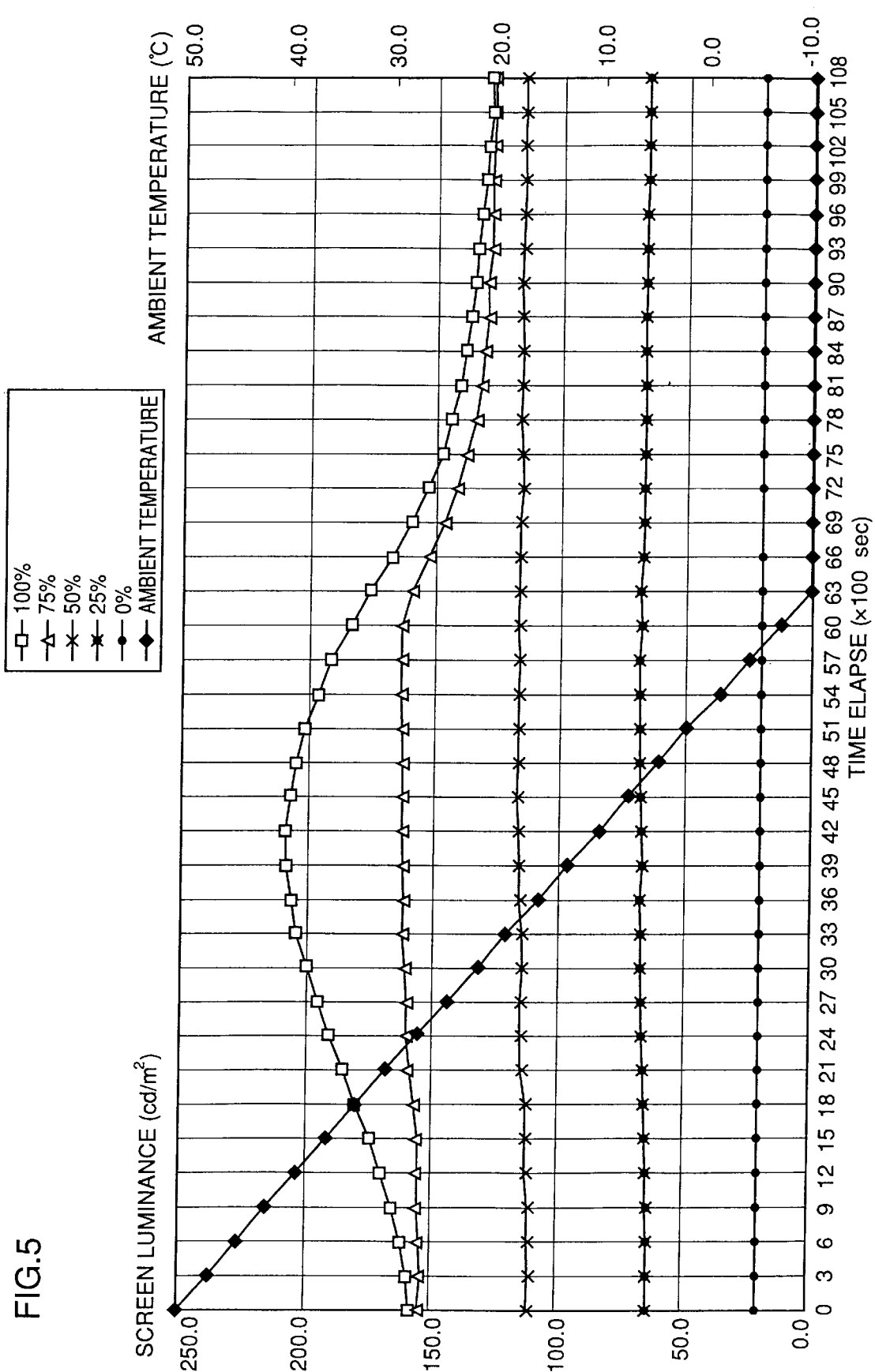
FIG. 5 shows luminance variation characteristics of a cold cathode fluorescent tube employed in an embodiment of the present invention.

FIG. 4 is a flow chart for describing the operation of a luminance control device according to another embodiment of the present invention. FIG. 5 shows the luminance variation characteristics of a cold cathode fluorescent tube.

The operation of a luminance control device according to another embodiment of the present invention will be described hereinafter with reference to FIGS. 1–5. At step SP1 (step abbreviated as SP hereinafter) of FIG. 4, MPU 22 sets the maximum luminance of the backlight. This maximum luminance setting is implemented at the time of shipment, at the time of exchanging fluorescent tube 14 of FIG. 2, or at the time of exchanging light sensor 10. This setting is effected to absorb the difference in luminance for each set caused by variation in fluorescent tube 14 and by the sensitivity variation of light sensor 10. More specifically, fluorescent tube 14 is made to emit light at the maximum luminance of 100% and aged. When the luminance of fluorescent tube 14 is stabilized, MPU 22 stores the output of light sensor 10 that is converted into a digital signal by A/D converter 21. The stored value is the maximum luminance value (Ymax) of the set.

At steps SP2–SP7, MPU 22 controls the luminance of the backlight. This luminance control is repeated periodically in the general usage state after the above-described maximum luminance is set. More specifically, at step SP2, MPU 22 reads out the output of light sensor 10 that is converted into a digital signal by A/D converter 21. This is the current backlight luminance value (Y).

At step SP3, the user luminance set value (UY) is read. This luminance set value (UY) can be set arbitrarily by a user by operation of a switch that is attached to the set. This value represents the desired usage in % with respect to the maximum luminance. At step SP4, MPU 22 computes the target luminance sensor value (YX) according to the maximum luminance Ymax and the user luminance set value (UY).

At step SP5, the luminance sensor value Y is compared with the target sensor value YX. When the compared values match, the process ends. Otherwise, control proceeds to step SP6. A predetermined value is added to (or subtracted from) the luminance control output value so that the luminance sensor value (Y) detected by light sensor 10 approximates the target luminance sensor value (YX). The computed luminance control output value is provided to D/A converter 23 at step SP7. The luminance control output value is converted into an analog signal by D/A converter 23. Therefore, when the luminance set value is set as 50%, for example, the backlight can emit substantially constant quantity of light even when the environmental conditions such as ambient temperature differ, as shown in FIG. 5.

Thus, the screen luminance that varies set by set can be provided effectively 100%. Luminance control can be provided regardless of variation in the sensitivity of the light sensor 10. A stable light adjusted ratio (the ratio of the maximum luminance to the minimum luminance) can be ensured. It is also possible to identify the decreasing rate of the luminance due to degradation of fluorescent tube 14 by storing the initial maximum luminance. This value can be used as a reference for the time to exchange fluorescent tube 14.

According to the present embodiment, the quantity of light when the backlight is lit at the maximum luminance is detected and the backlight is controlled using the detected quantity of light as a reference, so that the luminance set by the user can be obtained. The effect of variations in the luminance of the backlight and in the sensitivity of the sensor itself can be canceled to provide accurate luminance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A combination, comprising:
  a liquid crystal module having a liquid crystal panel forming a front surface, a reflector sheet forming an opposing back surface, and a diffusion sheet, a light collective sheet, and a light directing plate located between said front and back surfaces, said light directing plate including a flourescent tube for backlight provided at an edge of said light directing plate;
  a light sensor located behind said back surface for detecting light transmitted rearwardly through said reflector sheet from said backlight; and
  a cushion member for substantially preventing light other than the light transmitted from said reflector sheet from reaching said light sensor.

2. The combination according to claim 1, wherein said light sensor is attached to a printed circuit board, and wherein a sense antenna is provided around said light sensor for detecting electric field radiation emitted from said liquid crystal module.

3. A luminance control device for controlling luminance of a backlight for illuminating a liquid crystal module including a liquid crystal panel and a reflector sheet, and a diffusion sheet, a light collective sheet, and a light directing plate located between said liquid crystal panel and said reflector sheet, and a flourescent tube for backlight provided at an edge of said light directing plate, said luminance control device comprising:
  a photodetector for detecting a quantity of light when said backlight is lit at a maximum luminance, and for outputting a signal indicative of said quantity of light, said photodetector provided at the side of said reflector sheet opposite to said liquid crystal panel to detect light transmitted rearwardly through said reflector sheet;
  a cushion member for substantially preventing light other than the light transmitted from said reflector sheet from reaching said photodetector;
  luminance setting means for setting a desired luminance by a user as a function of a desired percentage of the maximum rumination of the backlight; and
  control means for controlling luminance of said backlight using said signal as a reference so that the luminance set by said luminance setting means is achieved.

4. The luminance control device of a liquid crystal module according to claim 3, wherein said photodetector is provided at the rear of said liquid crystal module to detect light transmitted rearwardly through said reflector sheet.

5. The luminance control device of a liquid crystal module according to claim 3, wherein said light sensor is attached to a printed circuit board, and wherein a sense antenna is provided around said light sensor for detecting electric field radiation emitted from said liquid crystal module.

6. A combination, comprising:
  a liquid crystal module having:
    a liquid crystal panel forming a front surface;
    an opposing back surface; and
    a backlight positioned between said front and back surfaces, said backlight transmitting light;
  a light sensor located behind said back surface for detecting light transmitted from said backlight through said back surface; and
  a cushion member for substantially preventing light other than the light transmitted through said back surface from reaching said light sensor.

7. The combination according to claim 6, wherein said back surface is a reflector sheet, and said liquid crystal module further includes a diffusion sheet, a light collective sheet, and a light directing plate located between said front and back surfaces, and a flourescent tube for backlight which is provided at an edge of said light directing plate,
  wherein said light sensor is provided at said reflector sheet side opposite to said liquid crystal panel to detect light transmitted rearwardly through said reflector sheet.

8. The combination according to claim 6, wherein said opposing back surface is a reflector sheet and said sensor detects light transmitted rearwardly through said reflector sheet.

* * * * *